US012119079B2

(12) United States Patent
Shah (10) Patent No.: US 12,119,079 B2
(45) Date of Patent: Oct. 15, 2024

(54) CIRCUITS AND METHODS OF MITIGATING HOLD TIME FAILURE OF PIPELINE FOR MEMORY DEVICE

(71) Applicant: Taiwan Semiconductor Manufacturing Company, Ltd., Hsinchu (TW)

(72) Inventor: Jaspal Singh Shah, Ottawa (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 177 days.

(21) Appl. No.: 17/831,148

(22) Filed: Jun. 2, 2022

(65) Prior Publication Data

US 2023/0282252 A1    Sep. 7, 2023

Related U.S. Application Data

(60) Provisional application No. 63/305,092, filed on Jan. 31, 2022.

(51) Int. Cl.
*G11C 16/04*    (2006.01)
*G11C 7/10*    (2006.01)
*G11C 7/22*    (2006.01)

(52) U.S. Cl.
CPC ............ *G11C 7/1039* (2013.01); *G11C 7/222* (2013.01)

(58) Field of Classification Search
CPC ................................ G11C 7/1039; G11C 7/222
See application file for complete search history.

(56) References Cited

U.S. PATENT DOCUMENTS

| | | | | |
|---|---|---|---|---|
| 6,633,995 B1* | 10/2003 | Nam | ................. | G06F 9/3869 |
| | | | | 713/400 |
| 7,975,170 B2* | 7/2011 | Hummler | ............. | G11C 11/406 |
| | | | | 365/222 |
| 2004/0250040 A1* | 12/2004 | Kim | .................... | G11C 7/1039 |
| | | | | 711/169 |
| 2009/0273993 A1 | 11/2009 | Byun | | |
| 2015/0179248 A1 | 6/2015 | Patil et al. | | |
| 2020/0321039 A1 | 10/2020 | Kim et al. | | |

OTHER PUBLICATIONS

Office Action issued in connection with Taiwan Appl. No. 111149196 dated Dec. 26, 2023.

* cited by examiner

*Primary Examiner* — Pho M Luu
(74) *Attorney, Agent, or Firm* — FOLEY & LARDNER LLP (57) ABSTRACT

A memory device includes one or more memory cells, and a pipeline coupled to the one or more memory cells. The memory device includes a first pulse generator coupled to the one or more memory cells. The first pulse generator is configured to generate, based on a first delayed clock signal, a memory clock signal to control the one or more memory cells. The first delayed clock signal is delayed with respect to a clock signal. The memory device includes a second pulse generator to generate, based on a second delayed clock signal and the memory clock signal, a pipeline clock signal to provide data from the one or more memory cells through the pipeline. The second delayed clock signal is delayed with respect to the clock signal.

16 Claims, 9 Drawing Sheets

Generate, based on a first delayed clock signal, a memory clock signal to control one or more memory cells, the first delayed clock signal delayed from a clock signal

810

Generate, based on a second delayed clock signal and the memory clock signal, a pipeline clock signal to provide data from the one or more memory cells through a pipeline, the second delayed clock signal delayed from the clock signal

820

Provide, the data from the one or more memory cells through the pipeline, according to the pipeline clock signal

CIRCUITS AND METHODS OF MITIGATING HOLD TIME FAILURE OF PIPELINE FOR MEMORY DEVICE

CROSS-REFERENCE TO RELATED APPLICATION

This application claims priority to and the benefit of U.S. Provisional Application No. 63/305,092, filed Jan. 31, 2022, entitled "TECHNIQUE TO MITIGATE HOLD TIME FAILURE IN HIGH SPEED PIPELINE MEMORIES", which is incorporated herein by reference in its entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, but may lose the stored data once the power is shut off. Unlike volatile memory devices, non-volatile memory devices may retain data even after the power is shut off, but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to circuits and methods of mitigating hold time failure of a pipeline for a memory device. In one aspect, the memory device includes one or more memory cells, and a pipeline coupled to the one or more memory cells. In one aspect, the memory device includes a first pulse generator coupled to the one or more memory cells. In some embodiments, the first pulse generator is configured to generate, based on a first delayed clock signal, a memory clock signal to control the one or more memory cells. In one aspect, the first delayed clock signal is delayed with respect to a clock signal. In one aspect, the memory device includes a second pulse generator to generate, based on a second delayed clock signal and the memory clock signal, a pipeline clock signal to provide data from the one or more memory cells through the pipeline. In one aspect, the second delayed clock signal is delayed with respect to the clock signal.

Advantageously, the memory device can operate in an efficient manner. In one aspect, the memory device includes a clock control circuit to provide the clock signal. An output of the clock control circuit and an input of the first pulse generator may be connected through a first connection. In addition, the output of the clock control circuit and an input of the second pulse generator may be connected through a second connection. The first connection may be a first metal rail and the second connection may be a second metal rail. The first metal rail and the second metal rail may have large parasitic components (e.g., parasitic resistance, parasitic capacitance, or both), such that the first delayed clock signal corresponding to the clock signal delayed by the first metal rail can be provided to the first pulse generator and the second delayed clock signal corresponding to the clock signal delayed by the second metal rail can be provided to the second pulse generator. Because the amount of delay by the first connection and the amount of delay by the second connection may be different, if the second pulse generator generates the pipeline clock signal according to the second delayed clock signal (e.g., in response to an edge of the second delayed clock signal), the pipeline may receive or latch in incorrect data from one or more memory cells. In one aspect, the second pulse generator can generate, based on the second delayed clock signal and the memory clock signal, the pipeline clock signal, such that the one or more memory cells and the pipeline can be configured and operated in a synchronized manner. For example, the second pulse generator can generate the pipeline clock signal, in response to an edge of the second delayed clock signal or an edge of the memory clock signal. Hence, in case the delay associated with the second delayed clock signal is excessive, the second pulse generator can generate the pipeline clock signal, in response to the edge of the memory clock signal. Accordingly, the hold time failure of the pipeline for memory cells can be mitigated, and the memory device can operate in a reliable manner.

In some embodiments, one or more components can be embodied as one or more transistors. The transistors in this disclosure are shown to have a certain type (N-type or P-type), but embodiments are not limited thereto. The transistors can be any suitable type of transistors including, but not limited to, metal oxide semiconductor field effect transistors (MOSFETs), bipolar junction transistors (BJTs), high voltage transistors, high frequency transistors, FinFETs, planar MOS transistors with raised source/drains, nanosheet FETs, nanowire FETs, or the like. Furthermore, one or more transistors shown or described herein can be embodied as two or more transistors connected in parallel.

Figure 1:
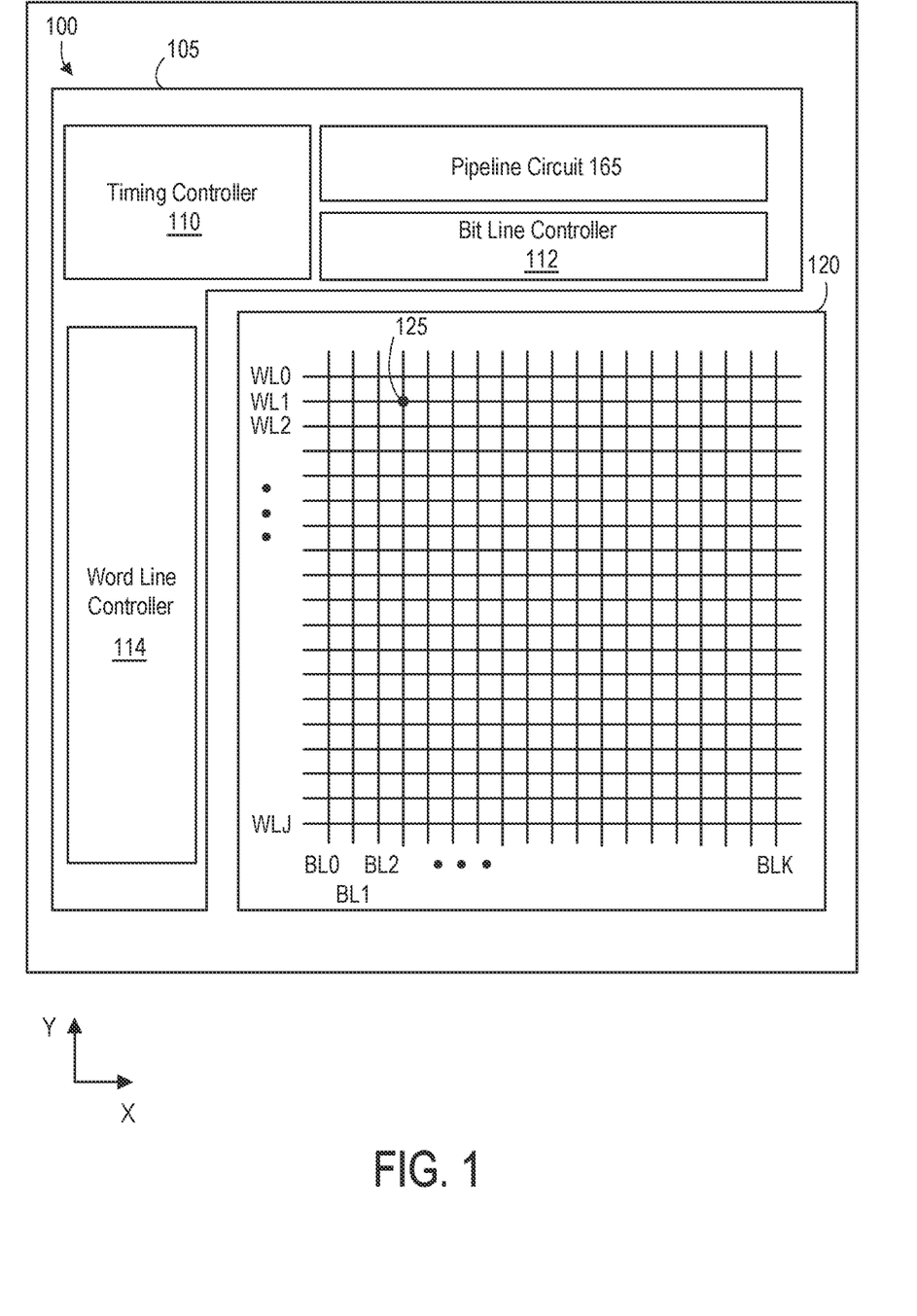
FIG. 1 illustrates a schematic block diagram of an example memory device, in accordance with some embodiments.

FIG. 1 is a diagram of a memory device 100, in accordance with one embodiment. In some embodiments, the memory device 100 includes a memory controller 105 and a memory array 120. The memory array 120 may include a plurality of storage circuits or memory cells 125 arranged in two or three dimensional arrays. Each memory cell 125 may be coupled to a corresponding word line WL and a corresponding bit line BL. The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. The memory array 120 includes word lines WL0, WL1 . . . . WLJ, each extending in a first direction (e.g., X-direction) and bit lines BL0, BL1 . . . . BLK, each extending in a second direction (e.g., Y-direction). The word lines WL and the bit lines BL may be conductive metals or conductive rails. In one aspect, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a nonvolatile memory, or a combination of them. In some embodiments, each memory cell 125 is embodied as a static random access memory (SRAM) cell or other type of memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, a timing controller 110, and a pipeline circuit 165. The bit line controller 112, the word line controller 114, the timing controller 110, the pipeline circuit 165 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the pipeline circuit 165 is a circuit that provides data from one or more memory cells 125 to an external device (e.g., processing device, or a computing device). In one configuration, the timing controller 110 is a circuit that provides control signals or clock signals to synchronize operations of the bit line controller 112, the word line controller 114, the pipeline circuit 165, or any combination of them. In some embodiments, the timing controller 110 is embodied as or includes a processor and a non-transitory computer readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112, the word line controller 114, and the pipeline circuit 165. In one approach, to write data to a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125. In one aspect, the timing controller 110 may generate control signals or clock signals to cause the bit line controller 112 and the pipeline circuit 165 to operate in a synchronized manner. For example, the timing controller 110 may generate a memory clock signal and provide the memory clock signal to the bit line controller 112 to cause the bit line controller 112 to sense a voltage or current corresponding to data stored by the memory cell 125. The timing controller 110 may also generate a pipeline clock signal and provide the pipeline clock signal to the pipeline circuit 165 to cause the pipeline circuit 165 to receive, obtain, or fetch data corresponding to the sensed voltage or current from the bit line controller 112. The pipeline circuit 165 may implement a first in first out (FIFO), and provide received data to an external device (e.g., processor or externa interface) in the order that they are received. In one aspect, a timing error or mismatch between the memory clock signal and the pipeline clock signal may cause the pipeline circuit 165 to receive, obtain, or fetch incorrect data. The timing controller 110 may generate the memory clock signal and the pipeline clock signal, such that the bit line controller 112 and the pipeline circuit 165 can operate in a synchronized manner to improve reliability of the memory device 100.

Figure 2:
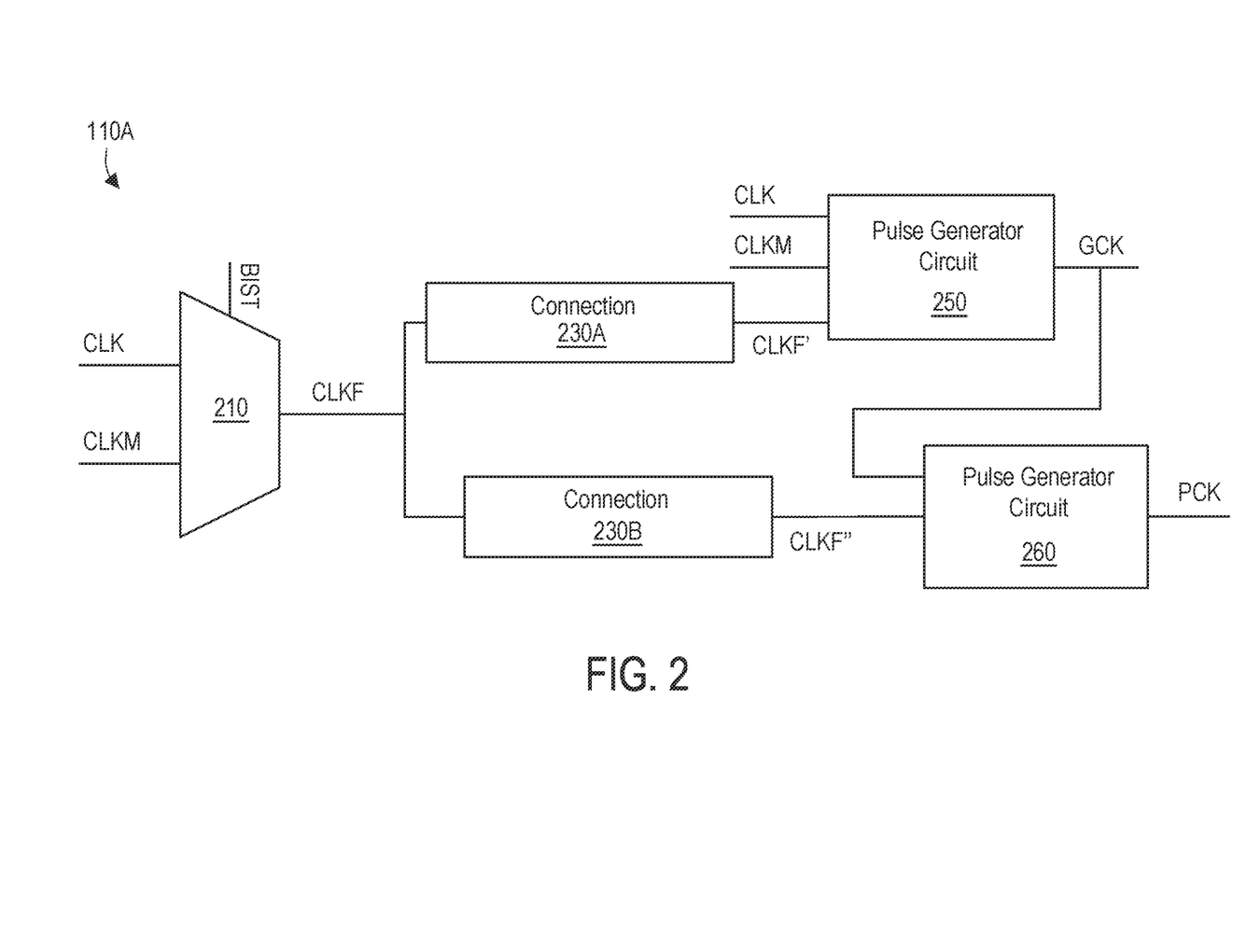
FIG. 2 illustrates a schematic block diagram of an example timing controller, in accordance with some embodiments.

FIG. 2 illustrates a schematic block diagram of an example timing controller 110A or a portion of the timing controller 110A, in accordance with some embodiments. In some embodiments, the timing controller 110A includes a multiplexer 210, a pulse generator circuit 250 and a pulse generator circuit 260. These components may operate together to generate pulses or clock signals GCK, PCK to operate the word line controller 114, the bit line controller 112, the pipeline circuit 165, or any combination of them. In some embodiments, these components are implemented as logic circuits or application specific integrated circuit. In some embodiments, the timing controller 110A includes more, fewer, or different components than shown in FIG. 2.

In some embodiments, the multiplexer 210 (also referred to as a clock control circuit 210" herein) is a circuit or a component that receives a first clock signal CLK or a second clock signal CLKM, and provides or outputs a selected clock signal CLKF, according to a control signal BIST. The first clock signal CLK may be a clock signal for operating a memory device, and the second clock signal CLKM may be a clock signal for performing a built-in self-test (BIST). The first clock signal CLK and the second clock signal CLKM may have different clock speeds (or different frequencies). The control signal BIST may be a signal to configure or operate the multiplexer 210 to select the first clock signal CLK or the second clock signal CLKM. The control signal BIST may be generated by a controller, processor, or an external component. In some embodiments, the multiplexer 210 is replaced by a different circuit that performs the functionality of the multiplexer 210 described herein. In one configuration, the multiplexer 210 includes a first input port to receive the first clock signal CLK, a second input port to receive the second clock signal CLKM, a control port to receive the control signal BIST, and an output port to output the selected clock signal CLKF. In this configuration, the multiplexer 210 may select one of the first clock signal CLK or the second clock signal CLKM, according to a voltage or a state of the control signal BIST, and provide the selected one of the first clock signal CLK or the second clock signal CLKM as the selected clock signal CLKF at the output port.

The pulse generator circuit 250 is a circuit or a component that receives a first delayed clock signal CLKF', the first clock signal CLK, and the second clock signal CLKM, and generates a memory clock signal GCK, according to the first delayed clock signal CLKF', the first clock signal CLK, and/or the second clock signal CLKM. The memory clock signal GCK may be a signal to control or operate the bit line controller 112, the word line controller 114, one or more selected memory cells 125, or any combination of them. In some embodiments, the pulse generator circuit 250 is replaced by a different circuit that performs the functionality of the pulse generator circuit 250 described herein. In one configuration, the pulse generator circuit 250 includes an input port coupled to an output port of the multiplexer 210 through a connection 230A, and an output port to provide the memory clock signal GCK. The connection 230A may include one or more metal rails or conductive rails. In one aspect, the connection 230A may delay the selected clock signal CLKF due to parasitic components (e.g., parasitic resistance or parasitic capacitance) of the connection 230A, such that the first delayed clock signal CLKF' delayed with respect to the selected clock signal CLKF can be provided to the pulse generator circuit 250. In some embodiments, the pulse generator circuit 250 generates the memory clock signal GCK, in response to any one of an edge (e.g., a rising edge or a falling edge) of the first delayed clock signal CLKF', the first clock signal CLK or the second clock signal CLKM, such that the memory clock signal GCK can be generated at proper timing, for example, to have an edge or a pulse within a predetermined threshold time from an edge or a pulse of the selected clock signal CLKF, despite the delay of the first delayed clock signal CLKF'. For example, if the first delayed clock signal CLKF' is delayed more than a predetermined threshold due to the connection 230A, the pulse generator circuit 250 may generate the memory clock signal GCK, in response to an edge (e.g., rising edge) of the first clock signal CLK or the second clock signal CLKM. For example, if the first delayed clock signal CLKF' is not delayed more than the predetermined threshold despite the connection 230A, the pulse generator circuit 250 may generate the memory clock signal GCK, in response to an edge (e.g., rising edge) of the first delayed clock signal CLKF'. In one aspect, the pulse generator circuit 250 may generate the memory clock signal GCK having a pulse width allowing sufficient for time memory cells 125 to be configured, according to an edge (e.g., falling edge) of the first clock signal CLK or the second clock signal CLKM. The pulse generator circuit 250 may provide the memory clock signal GCK to the bit line controller 112, the word line controller 114, one or more selected memory cells 125, or any combination of them to read data stored by the selected memory cells 125.

The pulse generator circuit 260 is a circuit or a component that receives a second delayed clock signal CLKF'" and the memory clock signal GCK, and generates a pipeline clock signal PCK according to the second delayed clock signal CLKF'" and/or the memory clock signal GCK. The pipeline clock signal PCK may be a signal to control or operate the pipeline circuit 165. In some embodiments, the pulse generator circuit 260 is replaced by a different circuit that performs the functionality of the pulse generator circuit 260 described herein. In one configuration, the pulse generator circuit 260 includes a first input port coupled to the output port of the multiplexer 210 through a connection 230B, a second input port coupled to an output port of the pulse generator circuit 250, and an output port to provide the pipeline clock signal PCK. The connection 230B may include one or more metal rails or conductive rails. In one aspect, the connection 230B may delay the selected clock signal CLKF due to parasitic components (e.g., parasitic resistance or parasitic capacitance) of the connection 230B, such that the second delayed clock signal CLKF'" delayed with respect to the selected clock signal CLKF can be provided to the pulse generator circuit 260. The connection 230B may be longer than the connection 230A, such that the second delayed clock signal CLKF'" may be delayed with respect to the selected clock signal CLKF by a larger amount than an amount of delay of the first delayed clock signal CLKF' with respect to the selected clock signal CLKF. In some embodiments, the pulse generator circuit 260 generates the pipeline clock signal PCK, in response to any one of an edge (e.g., a rising edge or a falling edge) of the second delayed clock signal CLKF'" or the memory clock signal GCK. The pulse generator circuit 260 may provide the pipeline clock signal PCK to the pipeline circuit 165 to cause or configure the pipeline circuit 165 to i) receive data from the selected memory cells 125 obtained, in response to an edge of the second delayed clock signal CLKF'" or the memory clock signal GCK, and ii) provide the received data to an external device (e.g., processor or external interface). In one example, in case the delay associated with the second delayed clock signal CLKF'" is larger than a predetermined time to cause the pipeline clock signal PCK to have an edge or a pulse after a hold time of one or more memory cells 125 holding data, the pulse generator circuit 260 can generate the pipeline clock signal PCK, in response to the edge of the memory clock signal GCK. By generating the pipeline clock signal PCK based on the second delayed clock signal CLKF" or the memory clock signal GCK, the pulse generator circuit 260 can generate the pipeline clock signal PCK at proper timing, for example, within the hold time of the one or more memory cells 125 holding data, despite the delay of the second delayed clock signal CLKF".

Figure 3:
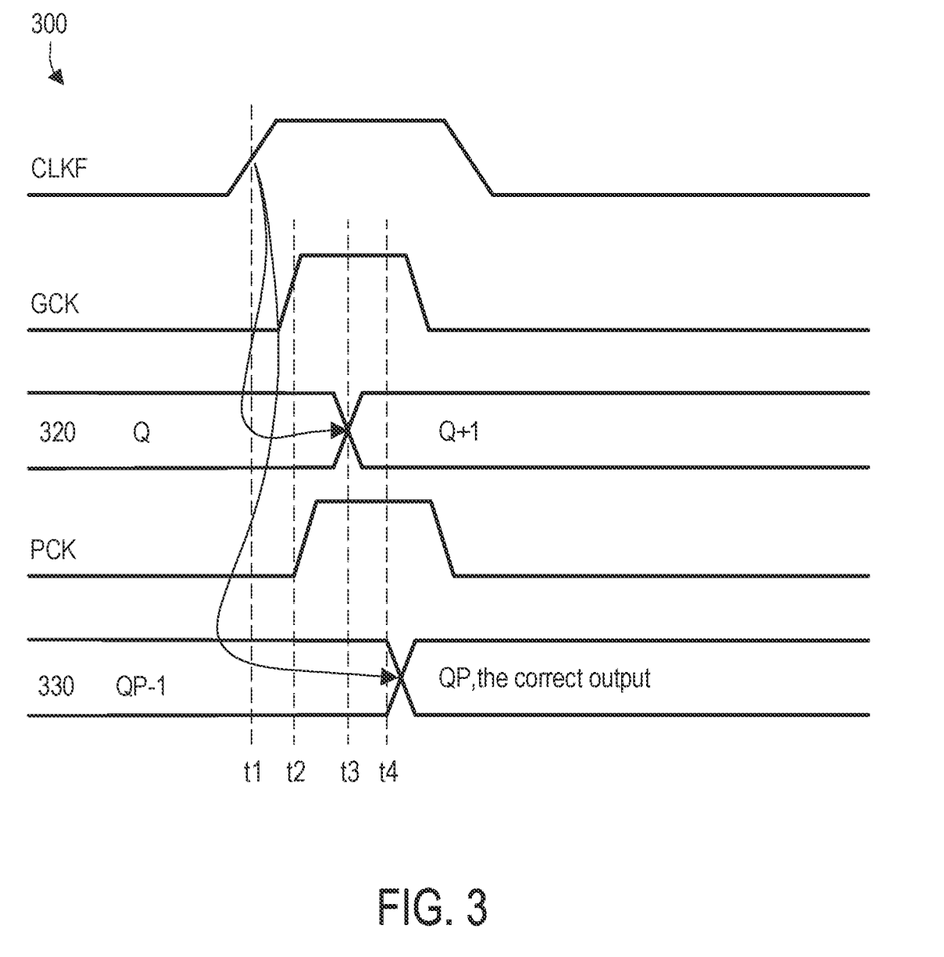
FIG. 3 is a timing diagram showing timing of providing data through a pipeline of a memory device, in accordance with some embodiments.

FIG. 3 is a timing diagram 300 showing an operation of providing data through a pipeline circuit 165 of a memory device 100, in accordance with some embodiments. The timing diagram 300 shows the selected clock signal CLKF, the memory clock signal GCK, data 320 of a memory cell 125 obtained by the bit line controller 112, the pipeline clock signal PCK, and data 330 received by the pipeline circuit 165.

In one approach, at time t1, the multiplexer 210 may generate the selected clock signal CLKF transitioning from a low voltage (e.g., 0V) to a high voltage (e.g., 1V). At time t1 or prior to time t1, according to the selected clock signal CLKF having the low voltage, the pulse generator circuit 250 may generate the memory clock signal GCK having a low voltage (e.g., 0V). Similarly, at time t1 or prior to time t1, according to the selected clock signal CLKF having the low voltage, the pulse generator circuit 260 may generate the pipeline clock signal PCK having a low voltage (e.g., 0V). At time t1 or prior to time t1, the bit line controller 112 may latch and hold data Q of a memory cell 125, while the pipeline circuit 165 receives data QP-1 corresponding to a data Q-1 of another memory cell 125 latched or held by the bit line controller 112 during a previous clock cycle.

In one approach, at time t2, the multiplexer 210 may generate or maintain the selected clock signal CLKF having the high voltage (e.g., 1V). At time t2, according to the selected clock signal CLKF having the high voltage, the pulse generator circuit 250 may generate the memory clock signal GCK having a high voltage (e.g., 1V). The selected clock signal CLKF may be delayed by parasitic components of the connection 230A, such that the pulse generator circuit 250 may receive the first delayed clock signal CLKF'. The pulse generator circuit 250 may receive the first delayed clock signal CLKF', and generate the memory clock signal GCK transitioning from the low voltage to the high voltage at time t2, in response to a rising edge of the first delayed clock signal CLKF'. At time t2, the pulse generator circuit 260 may receive the memory clock signal GCK from the pulse generator circuit 250, and generate the pipeline clock signal PCK transitioning from the low voltage to the high voltage, in response to the rising edge of the memory clock signal GCK. At time t2, the bit line controller 112 may continue to hold data Q of the memory cell 125. At time t2, the pipeline circuit 165 may start receiving, latching in or loading the data Q of the memory cell 125 from the bit line controller 112, in response to the rising edge of the pipeline clock signal PCK.

In one approach, at time t3, the multiplexer 210 may generate or maintain the selected clock signal CLKF having the high voltage (e.g., 1V). At time t3, the pulse generator circuit 250 may generate or maintain the memory clock signal GCK having the high voltage. Similarly, at time t3, the pulse generator circuit 260 may generate the pipeline clock signal PCK having the high voltage. At time t3, the bit line controller 112 may obtain, receive, or latch data Q+1 of an additional memory cell 125 for a subsequent clock cycle after a certain delay from the rising edge of the memory clock signal GCK at time t2.

In one approach, at time t4, the multiplexer 210 may generate or maintain the selected clock signal CLKF having the high voltage (e.g., 1V). At time t4, the pulse generator circuit 250 may generate or maintain the memory clock signal GCK having the high voltage. Similarly, at time t4, the pulse generator circuit 260 may generate the pipeline clock signal PCK having the high voltage. At time t4, the bit line controller 112 may hold data Q+1 of an additional memory cell 125. Meanwhile, at time t4, the pipeline circuit 165 may complete receiving or loading the data QP, after a certain delay from a rising edge of the pipeline clock signal PCK at time t2.

Advantageously, generating the pipeline clock signal PCK, in response to the rising edge of the memory clock signal GCK may allow the pipeline circuit 165 to operate correctly, despite delay associated with the connection 230B. For example, if the pulse generator circuit 260 generates the pipeline clock signal PCK based on the second delayed clock signal CLKF" alone, the pulse generator circuit 260 may receive or latch incorrect data from the bit line controller 112 due to excessive delay associated with the connection 230B. For example, if the pulse generator circuit 260 generates the pipeline clock signal PCK based on the second delayed clock signal CLKF" alone, the pulse generator circuit 260 may generate the pipeline clock signal PCK having a rising edge after time t3 because of the delay associated with the connection 230B. The pipeline clock signal PCK having a rising edge after time t3 may cause the pipeline circuit 165 to receive or load the data Q+1 of the additional memory cell 125 instead of the data Q of the memory cell 125. By generating the pipeline clock signal PCK in response to the rising edge of the memory clock signal GCK, the pipeline circuit 165 may receive or load the data Q of the memory cell 125 despite the delay associated with the connection 230B, such that the memory device 100 may eschew or mitigate hold time violation.

Figure 4:
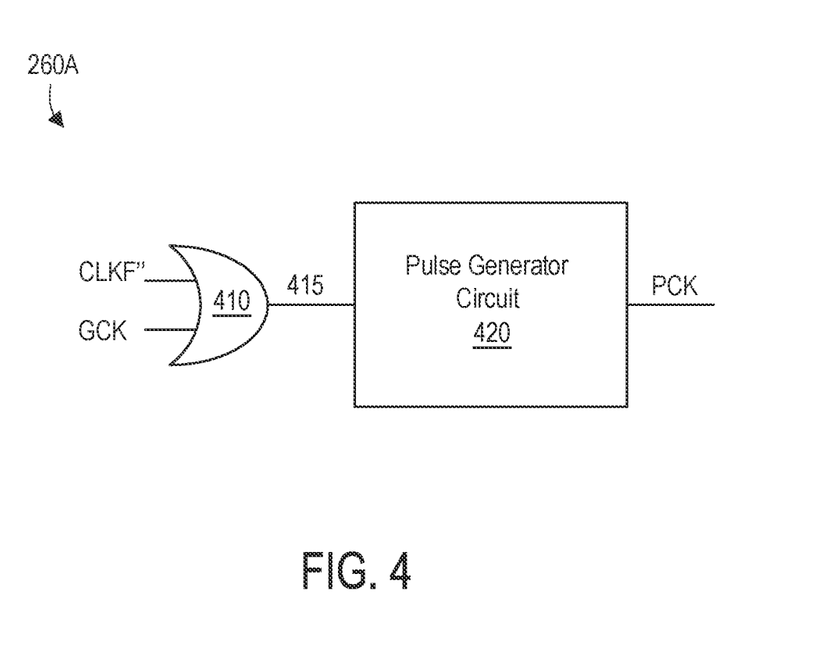
FIG. 4 illustrates a schematic diagram of a pulse generator circuit, in accordance with some embodiments.

FIG. 4 illustrates a schematic diagram of a pulse generator circuit 260A, in accordance with some embodiments. In some embodiments, the pulse generator circuit 260A may include an OR gate 410 and a pulse generator circuit 420 that generates the pipeline clock signal PCK. These components may operate together to generate the pipeline clock signal PCK, based on the delayed clock signal CLKF" and the memory clock signal GCK. In some embodiments, the pulse generator circuit 260A includes more, fewer, or different components than shown in FIG. 4.

In some embodiments, the OR gate 410 is a circuit that receives the delayed clock signal CLKF" and the memory clock signal GCK, and generates a control signal 415 according to the delayed clock signal CLKF" and the memory clock signal GCK. In some embodiments, the OR gate 410 can be replaced by a different circuit or a component that can perform the functionality of the OR gate 410 disclosed herein. In one configuration, the OR gate 410 includes a first input port coupled to the output port of the multiplexer 210 through the connection 230B to receive the delayed clock signal CLKF", a second input port coupled to the output port of the pulse generator circuit 250 to receive the memory clock signal GCK, and an output port to provide the control signal 415. In this configuration, the OR gate 410 may perform an OR operation on the delayed clock signal CLKF" and the memory clock signal GCK, and generate the control signal 415 according to the OR operation. The OR gate 410 may provide the control signal 415 to the pulse generator circuit 420.

In some embodiments, the pulse generator circuit 420 is a circuit that generates the pipeline clock signal PCK, according to the control signal 415. In some embodiments, the pulse generator circuit 420 can be replaced by a different circuit or a component that can perform the function of the pulse generator circuit 420 disclosed herein. In one configuration, the pulse generator circuit 420 includes an input port coupled to the output port of the OR gate 410. In this configuration, the pulse generator circuit 420 may generate the pipeline clock signal PCK, in response to an edge (e.g., rising edge) of the control signal 415. For example, the pipeline clock signal PCK may have a rising edge, in response to the rising edge of the control signal 415. Accordingly, the pulse generator circuit 420 may generate the pipeline clock signal PCK, in response to a rising edge of the delayed clock signal CLKF" or a rising edge of the memory clock signal GCK. An example of the pulse generator circuit 420 is provided below with respect to FIG. 5.

Figure 5:
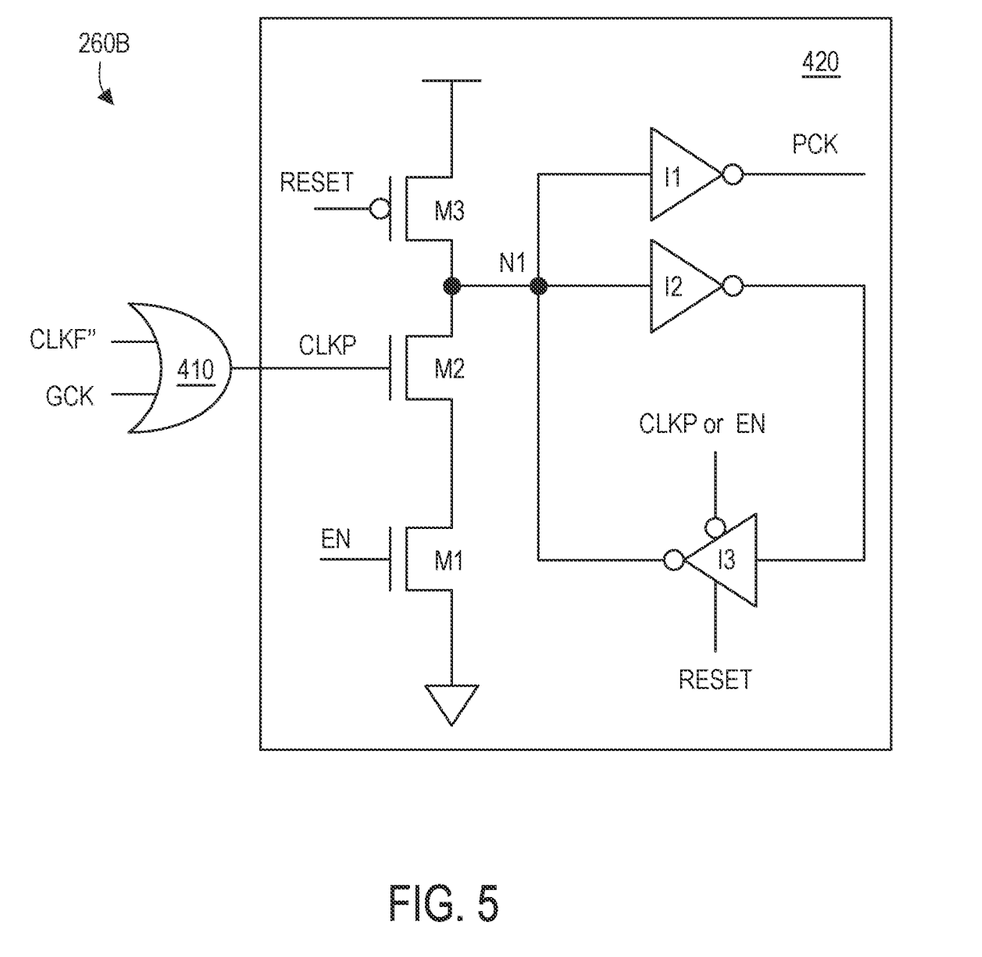
FIG. 5 illustrates a schematic diagram of a pulse generator circuit, in accordance with some embodiments.

FIG. 5 illustrates a schematic diagram of the pulse generator circuit 260B, in accordance with some embodiments. In some embodiments, the pulse generator circuit 420 includes transistors M1, M2, M3, and inverters I1, I2, I3. These components may operate together to generate the pipeline clock signal PCK, in response to an edge (e.g., rising edge) of a control signal CLKP. In some embodiments, the transistors M1, M2 are embodied as N-type transistors (e.g., N-type MOSFET, N-type FinFET, etc.), and the transistor M3 is embodied as a P-type transistor (e.g., P-type MOSFET, P-type FinFET, etc.). In some embodiments, the transistors M1, M2, M3 are embodied as different transistors than shown in FIG. 5. In some embodiments, the pulse generator circuit 420 includes more, fewer, or different components than shown in FIG. 5.

In one configuration, the transistors M1, M2 may be connected to each other in series between i) a power rail to receive a ground voltage (e.g., 0V) and ii) a node N1. The transistor M1 may include a source electrode coupled to the power rail to receive the ground voltage (e.g., 0V), a gate electrode to receive an enable signal EN, and a drain electrode. The enable signal EN may be a signal to enable a current path or discharging through the transistors M1, M2. The enable signal EN may be generated by a control circuit of the timing controller 110 or an external device. In one configuration, the transistor M2 includes the source electrode coupled to the drain electrode of the transistor M1, a gate electrode coupled to the output port of the OR gate 410, and a drain electrode coupled to the node N1. For example, the transistor M1 may be enabled, in response to the enable signal EN having a high voltage (e.g., 1V). The transistor M1 may be disabled, in response to the enable signal EN having a low voltage (e.g., 0V). Similarly, for example, the transistor M2 may be enabled, in response to the control signal CLKP having a high voltage (e.g., 1V). The transistor M2 may be disabled, in response to the control signal CLKP having a low voltage (e.g., 0V). When the transistors M1, M2 are both enabled, current may flow from the node N1 through the transistors M1, M2 to discharge the node N1, such that a voltage at the node N1 can be 0V. When any of the transistors M1, M2 is disabled, current may not flow from the node N1 through the transistors M1, M2, such that the node N1 may not be discharged.

In one configuration, the transistor M3 includes the source electrode coupled to a power rail to receive a supply voltage (e.g., VDD or 1V), a gate electrode to receive a reset signal RESET, and a drain electrode coupled to the node N1. The reset signal RESET may be a signal to reset a voltage at the node N1. The reset signal RESET may be generated by the control circuit of the timing controller 110 or the external device. The transistor M3 may be enabled, in response to the reset signal RESET having a low voltage (e.g., 0V). The transistor M3 may be disabled, in response to the reset signal RESET having a high voltage (e.g., 1V). When the transistor M3 is enabled, current may flow through the transistor M3 to charge the node N1, such that a voltage at the node N1 can be 1V. When the transistor M3 is disabled, current may not flow through the transistor M3, such that the node N1 may not be charged.

In one aspect, the inverters I2, I3 form a latch. In one configuration, the inverter I2 includes an input port coupled to the node N1, and an output port coupled to an input port of the inverter I3, where the output port of the inverter I3 is coupled to the node N1. The inverter I3 may be powered, according to an inverse of the control signal CLKP or an inverse of the enable signal EN. Accordingly, when the transistors M1, M2 are enabled to discharge the node N1 such that a voltage at the node N1 can be 0V, the inverter I3 can be disabled to avoid the inverter I3 supplying current to the node N1 while the transistors M1, M2 are enabled.

In one configuration, the inverter I1 includes an input port coupled to the node N1, and an output port to provide the pipeline clock signal PCK. In one aspect, the voltage at the node N1 may correspond to the pipeline clock signal PCK. For example, the voltage at the node N1 may have an inverted phase of the pipeline clock signal PCK.

Figure 6:
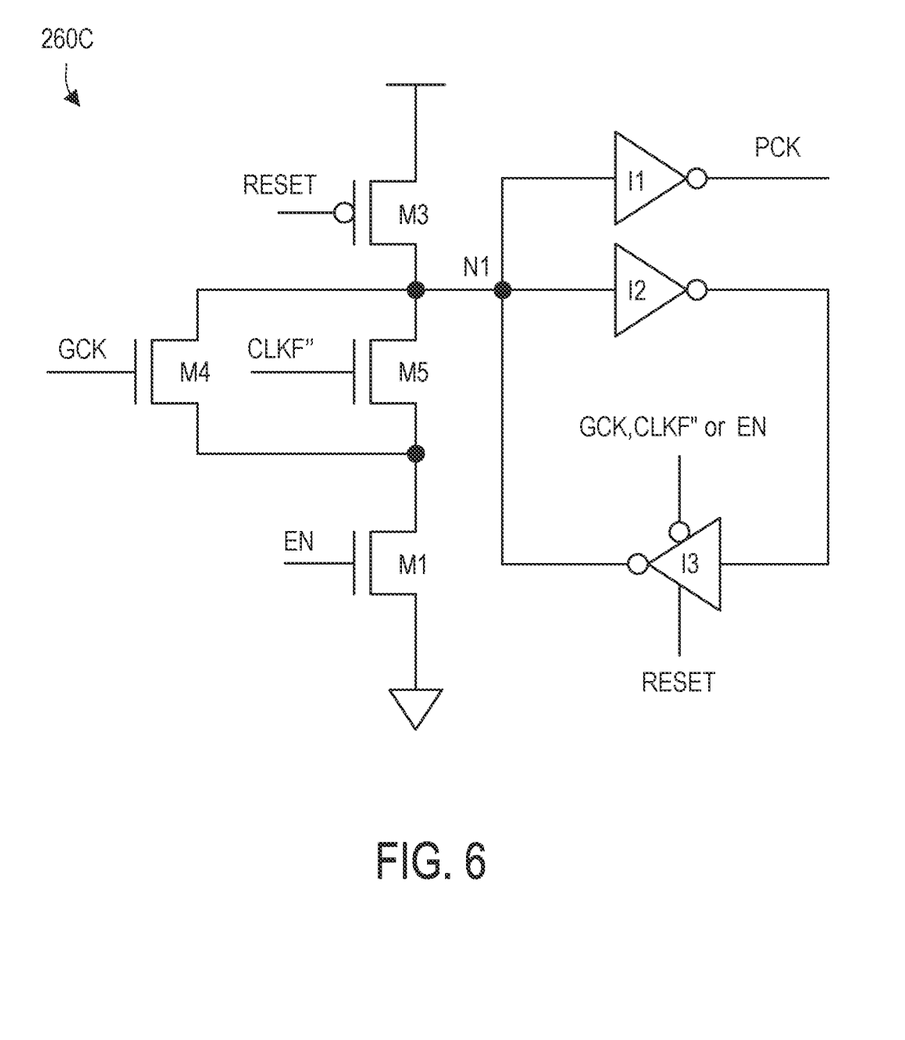
FIG. 6 illustrates a schematic diagram of a pulse generator circuit, in accordance with some embodiments.

FIG. 6 illustrates a schematic diagram of a pulse generator circuit 260C, in accordance with some embodiments. In one aspect, the pulse generator circuit 260C is similar to the pulse generator circuit 260A, except the OR gate 410 and the transistor M2 are omitted, and transistors M4, M5 are added. The transistors M4, M5 may be N-type transistors (e.g., N-type MOSFET, N-type FinFET, etc.). Thus, detailed description of duplicated portion thereof is omitted herein for the sake of brevity.

In one aspect, the transistors M4, M5 are connected in parallel between the node N1 and the transistor M1. In one configuration, the transistor M4 includes the source electrode coupled to the drain electrode of the transistor M1, a gate electrode coupled to the output port of the pulse generator circuit 250, and a drain electrode coupled to the node N1. In one configuration, the transistor M5 includes the source electrode coupled to the drain electrode of the transistor M1, a gate electrode coupled to the output port of the multiplexer 210 through the connection 230B, and a drain electrode coupled to the node N1. For example, the transistor M4 may be enabled, in response to the memory clock signal GCK having a high voltage (e.g., 1V). The transistor M4 may be disabled, in response to the memory clock signal GCK having a low voltage (e.g., 0V). Similarly, for example, the transistor M5 may be enabled, in response to the second delayed clock signal CLKF" having a high voltage (e.g., 1V). The transistor M5 may be disabled, in response to the second delayed clock signal CLKF" having a low voltage (e.g., 0V). When the transistor M1 and one of the transistors M4, M5 are enabled, current may flow from the node N1 through the transistor M1 and the one of the transistors M4, M5 to discharge the node N1, such that a voltage of the node N1 can be 0V. When the transistor M1 is disabled or both transistors M4, M5 are disabled, current may not flow from the node N1 through the transistor M1. In this configuration, the pulse generator circuit 260C may operate in a similar manner as the pulse generator circuit 260A, according to the memory clock signal GCK or the second delayed clock signal CLKF" without implementing the OR gate 410.

Figure 7:
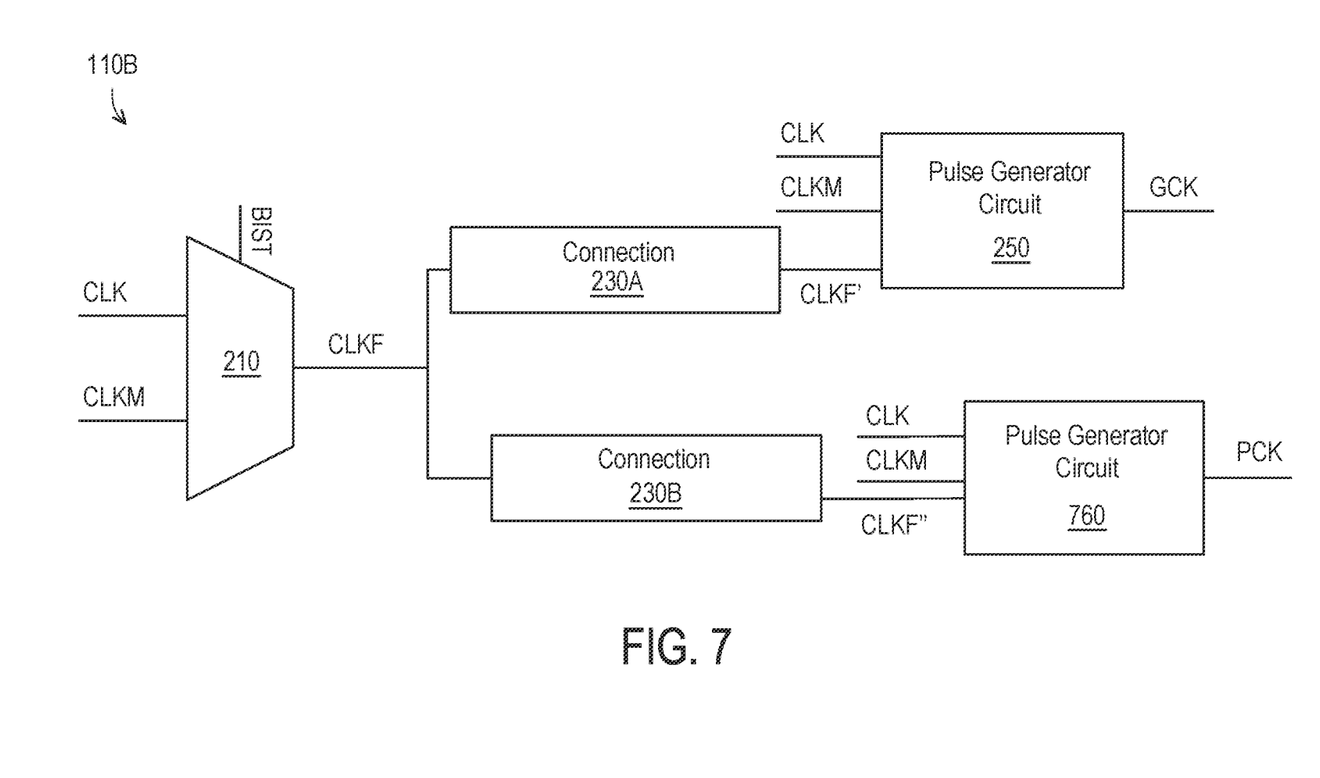
FIG. 7 illustrates a schematic block diagram of an example timing controller, in accordance with some embodiments.

FIG. 7 illustrates a schematic block diagram of an example timing controller 110B, in accordance with some embodiments. In some embodiments, the timing controller 110B is similar to the timing controller 110A of FIG. 2, except the timing controller 110B includes a pulse generator circuit 760 instead of the pulse generator circuit 260. Thus, detailed description of duplicated portion thereof is omitted herein for the sake of brevity. The pulse generator circuit 760 may be a replicate circuit of the pulse generator circuit 250 or a circuit having identical components and configuration of those of the pulse generator circuit 250, such that the pulse generator circuit 760 may receive the first clock signal, the second clock signal CLKM, and the second delayed clock signal CLKF''', and generate the pipeline clock signal PCK, according to the first clock signal, the second clock signal CLKM, and the second delayed clock signal CLKF'''. For example, the pulse generator circuit 760 may generate the pipeline clock signal PCK, according to an edge (e.g., rising edge) of the first clock signal CLK, an edge (e.g., rising edge) of the second clock signal CLKM, or an edge (e.g., rising edge) of the second delayed clock signal CLKF'''. Hence, the pulse generator circuit 760 may generate the pipeline clock signal PCK at proper timing to have an edge or a pulse within a predetermined threshold time from an edge or a pulse of the selected clock signal CLKF, despite the delayed associated with the connection 230B.

Figure 8:
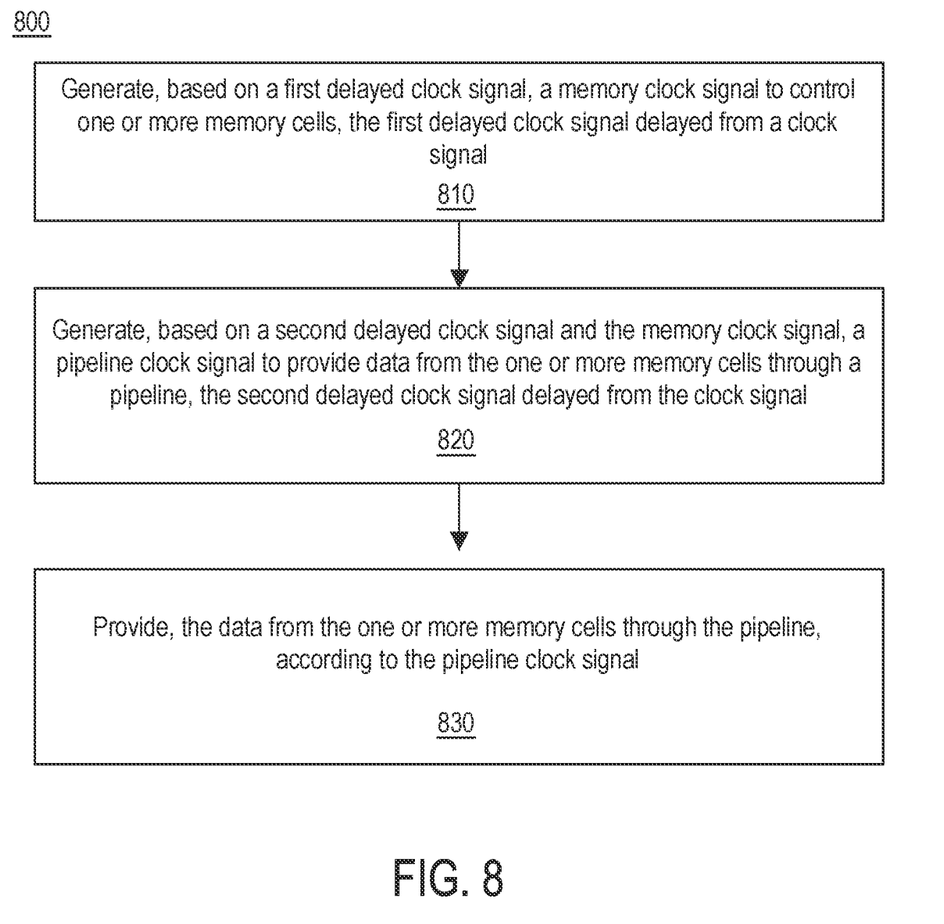
FIG. 8 is a flowchart showing a method of providing data stored by one or more memory cells through a pipeline, in accordance with some embodiments.

FIG. 8 is a flowchart showing a method 800 of providing data stored by one or more memory cells 125 through a pipeline (or a pipeline circuit 165), in accordance with some embodiments. In some embodiments, the method 800 is performed by a controller (e.g., memory controller 105 or timing controller 110). In some embodiments, the method 800 is performed by other entities. In some embodiments, the method 800 includes more, fewer, or different steps than shown in FIG. 8.

In one approach, the controller generates 810, based on a first delayed clock signal (e.g., delayed clock signal CLKF'), a memory clock signal (e.g., memory clock signal GCK) to control one or more memory cells (e.g., memory cell 125). For example, the pulse generator circuit 250 may receive the first delayed clock signal and generate the memory clock signal according to the first delayed clock signal. In one example, the clock control circuit (or the multiplexer 210) may generate the selected clock signal CLKF, selected from one of the first clock signal CLK or the second clock signal CLKM, and provide the selected clock signal CLKF to the pulse generator circuit 250 through a connection 230A. The selected clock signal CLKF may be delayed by the connection 230A (e.g., metal rail) between the clock control circuit (or the multiplexer 210) and the pulse generator circuit 250 due to parasitic components (e.g., parasitic resistance or parasitic capacitance) of the connection 230A, such that the pulse generator circuit 250 may receive the first delayed clock signal.

In one approach, the controller generates 820, based on a second delayed clock signal (e.g., second delayed clock signal CLKF'') and the memory clock signal (e.g., memory clock signal GCK), a pipeline clock signal (e.g., pipeline clock signal PCK) to provide data from the one or more memory cells through a pipeline (or pipeline circuit 165). For example, the pulse generator circuit 260 may receive the first delayed clock signal and generate the memory clock signal according to the first delayed clock signal. In one example, the clock control circuit (or the multiplexer 210) may provide the selected clock signal CLKF to the pulse generator circuit 260 through a connection 230B. The selected clock signal CLKF may be delayed by the connection 230B (e.g., metal rail) between the clock control circuit (or the multiplexer 210) and the pulse generator circuit 260 due to parasitic components (e.g., parasitic resistance or parasitic capacitance) of the connection 230B, such that the pulse generator circuit 250 may receive the second delayed clock signal. In one aspect, the connection 230B may be longer than the connection 230A, such that the second delayed clock signal (e.g., second delayed clock signal CLKF'') may be delayed by a larger amount than the first delayed clock signal (e.g., first delayed clock signal CLKF'). In one approach, the pulse generator circuit 260 generates the pipeline clock signal (e.g., pipeline clock signal PCK), in response to a rising edge of the second delayed clock signal (e.g., second delayed clock signal CLKF'') or a rising edge of the pipeline clock signal (e.g., pipeline clock signal PCK).

In one approach, the controller provides 830, the data from the one or more memory cells through the pipeline (or pipeline circuit 165), according to the pipeline clock signal (e.g., pipeline clock signal PCK). For example, the pipeline circuit 165 may receive, obtain, or fetch data corresponding to the sensed voltage or current from the one or more memory cells or the bit line controller 112.

Advantageously, the memory device 100 can operate in an efficient manner. In one aspect, because the amount of delay by the first connection 230A and the amount of delay by the second connection 230B may be different, if the second pulse generator circuit 260 generates the pipeline clock signal PCK according to the second delayed clock signal CLKF'' alone, the pipeline (or pipeline circuit 165) may receive or latch in incorrect data from one or more memory cells. In one aspect, the second pulse generator circuit 260 can generate the pipeline clock signal PCK, in response to an edge of the second delayed clock signal CLKF'' or an edge of the memory clock signal GCK. Hence, in case the delay associated with the second delayed clock signal is excessive, the second pulse generator circuit 260 can generate the pipeline clock signal PCK, in response to the edge of the memory clock signal GCK, which is applied or used for configuring the memory cells 125. Accordingly, the hold time failure of the pipeline for memory cells 125 can be mitigated, and the memory device 100 can operate in a reliable manner.

Figure 9:
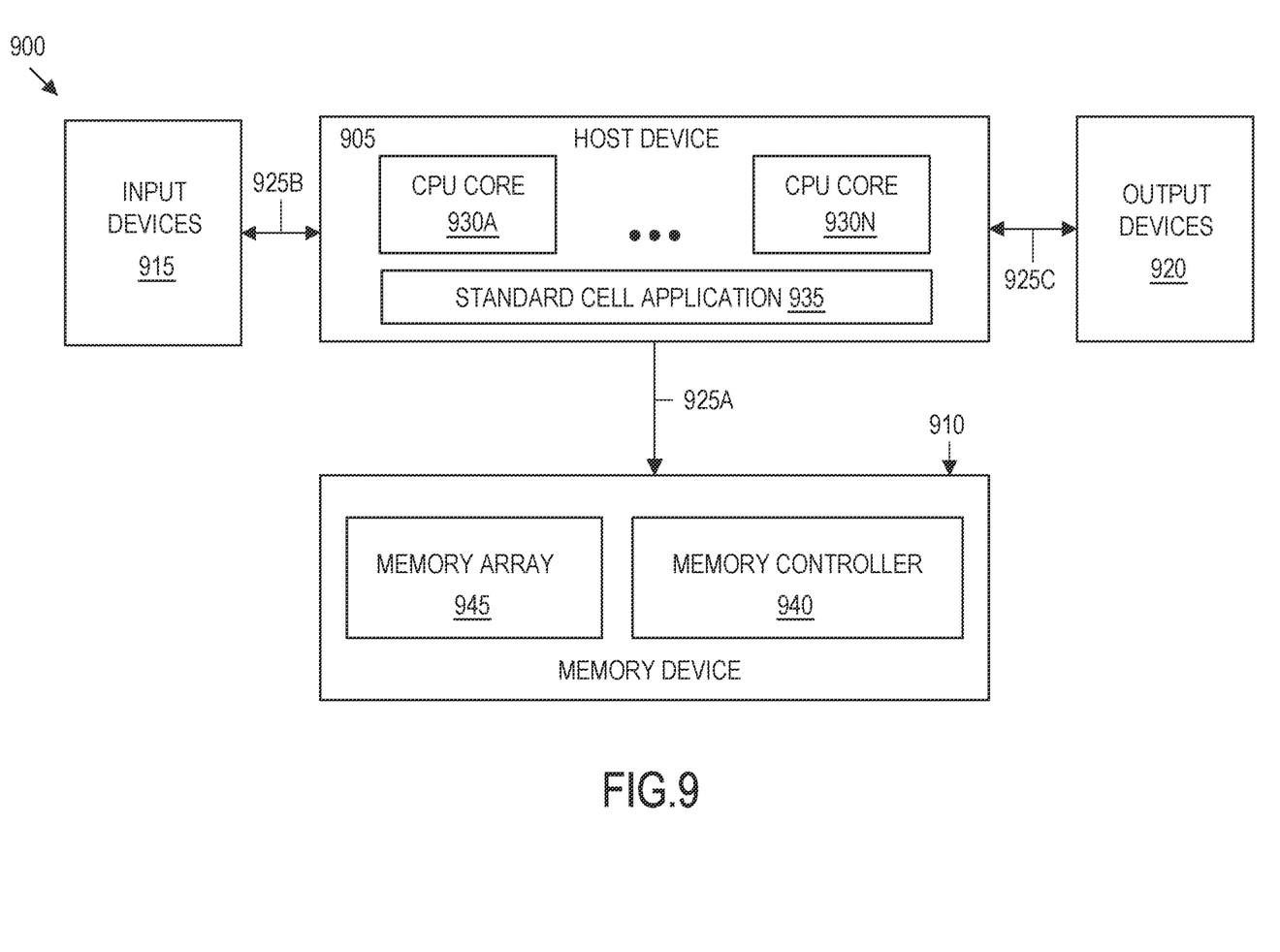
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A . . . 930N. The CPU cores 930A . . . 930N may be implemented as an Application Specific Integrated Circuit ("ASIC"), Field Programmable Gate Array ("FPGA"), or any other type of processing unit. Each of the CPU cores 930A . . . 930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A . . . 930N using the instructions associated with the standard cell application from the memory device 910. In one example, the standard cell application 935 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100, or any portion of the memory device 100 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device 910. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

In one aspect of the present disclosure, a memory device is disclosed. In some embodiments, the memory device includes one or more memory cells and a pipeline coupled to the one or more memory cells. In some embodiments, the memory device includes a first pulse generator coupled to the one or more memory cells. In some embodiments, the first pulse generator is configured to generate, based on a first delayed clock signal, a memory clock signal to control the one or more memory cells. In some embodiments, the first delayed clock signal is delayed with respect to a clock signal. In some embodiments, the memory device includes a second pulse generator to generate, based on a second delayed clock signal and the memory clock signal, a pipeline clock signal to provide data from the one or more memory cells through the pipeline. In some embodiments, the second delayed clock signal is delayed with respect to the clock signal.

In another aspect of the present disclosure, a device is disclosed. In some embodiments, the device includes a clock control circuit having a first output to provide a clock signal. In some embodiments, the device includes a first pulse generator including a first input coupled to the first output of the clock control circuit through a first metal rail. In some embodiments, the first pulse generator is configured to generate a memory clock signal to control one or more memory cells, based on a first delayed clock signal. In some embodiments, the first delayed clock signal is delayed with respect to the clock signal by the first metal rail. In some embodiments, the device includes a second pulse generator. In some embodiments, the second pulse generator includes a second input coupled to the first output of the clock control circuit through a second metal rail to receive a second delayed clock signal delayed with respect to the clock signal by the second metal rail. In some embodiments, the second pulse generator includes a third input coupled to a second output of the first pulse generator to receive the memory clock signal. In some embodiments, the second pulse generator is configured to generate a pipeline clock signal based on the second delayed clock signal and the memory clock signal. In some embodiments, the pipeline clock signal is to control a pipeline to provide data from the one or more memory cells.

In yet another aspect of the present disclosure, a method of operating a memory device is disclosed. In some embodiments, the method includes generating, by a memory controller based on a first delayed clock signal, a memory clock signal to control one or more memory cells. In some embodiments, the first delayed clock signal is delayed with respect to a clock signal. In some embodiments, the method includes generating, by the memory controller based on a second delayed clock signal and the memory clock signal, a pipeline clock signal to provide data from the one or more memory cells through a pipeline. In some embodiments, the second delayed clock signal is delayed with respect to the clock signal. In some embodiments, the method includes providing, by the memory controller, the data from the one or more memory cells through the pipeline, according to the pipeline clock signal.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   one or more memory cells;
   a pipeline coupled to the one or more memory cells;
   a first pulse generator coupled to the one or more memory cells, the first pulse generator to generate, based on a first delayed clock signal, a memory clock signal to control the one or more memory cells, the first delayed clock signal delayed with respect to a clock signal; and
   a second pulse generator to generate, based on a second delayed clock signal and the memory clock signal, a pipeline clock signal to provide data from the one or more memory cells through the pipeline, the second delayed clock signal delayed with respect to the clock signal, wherein the second pulse generator includes:
   an OR gate to perform an OR operation on the second delayed clock signal and the memory clock signal to generate a control signal, the pipeline clock signal generated based on the control signal and a transistor coupled to a node, the transistor to enable current through a node according to the control signal, a voltage at the node corresponding to the pipeline clock signal.

2. The memory device of claim 1, wherein the second pulse generator includes:
   a latch coupled to the node, an inverter of the latch is disabled when the transistor is enabled.

3. The memory device of claim 1, wherein the second pulse generator includes:
   a first transistor to receive the second delayed clock signal, and
   a second transistor coupled to the first transistor in parallel, the second transistor to receive the memory clock signal.

4. The memory device of claim 3,
   wherein the first transistor and the second transistor are coupled to a node, and
   wherein the second pulse generator includes a latch coupled to the node, a voltage at the node corresponding to the pipeline clock signal.

5. The memory device of claim 4, wherein an inverter of the latch is disabled, when the first transistor or the second transistor is enabled.

6. A device comprising:
   a clock control circuit having a first output to provide a clock signal;
   a first pulse generator including a first input coupled to the first output of the clock control circuit through a first metal rail, the first pulse generator to generate a memory clock signal to control one or more memory cells, based on a first delayed clock signal, the first delayed clock signal delayed with respect to the clock signal by the first metal rail; and
   a second pulse generator including:
      a second input coupled to the first output of the clock control circuit through a second metal rail to receive a second delayed clock signal delayed with respect to the clock signal by the second metal rail, and
      a third input coupled to a second output of the first pulse generator to receive the memory clock signal, wherein the second pulse generator is to generate a pipeline clock signal based on the second delayed clock signal and the memory clock signal, the pipeline clock signal to control a pipeline to provide data from the one or more memory cells.

7. The device of claim 6, wherein the second pulse generator includes:
   an OR gate to perform an OR operation on the second delayed clock signal and the memory clock signal to generate a control signal, the pipeline clock signal generated based on the control signal.

8. The device of claim 7, wherein the second pulse generator includes:

a transistor coupled to a node, the transistor to enable current through a node according to the control signal, a voltage at the node corresponding to the pipeline clock signal.

9. The device of claim 8, wherein the second pulse generator includes:
a latch coupled to the node, an inverter of the latch is disabled, when the transistor is enabled.

10. The device of claim 6, wherein the second pulse generator includes:
a first transistor including a gate electrode coupled to the first output of the clock control circuit through the second metal rail to receive the second delayed clock signal, and
a second transistor coupled to the first transistor in parallel, the second transistor including a gate electrode coupled to the second output of the first pulse generator to receive the memory clock signal.

11. The device of claim 10, wherein the second pulse generator includes:
wherein the first transistor and the second transistor are coupled to a node, and
wherein the second pulse generator includes a latch coupled to the node, a voltage at the node corresponding to the pipeline clock signal.

12. The device of claim 11, wherein an inverter of the latch is disabled when the first transistor or the second transistor is enabled.

13. A method comprising:
generating, by a memory controller based on a first delayed clock signal, a memory clock signal to control one or more memory cells, the first delayed clock signal delayed with respect to a clock signal;
generating, by the memory controller based on a second delayed clock signal and the memory clock signal, a pipeline clock signal to provide data from the one or more memory cells through a pipeline, the second delayed clock signal delayed with respect to the clock signal;
performing, by the memory controller, an OR operation on the second delayed clock signal and the memory clock signal to generate a control signal, the pipeline clock signal generated based on the control signal;
enabling, by the memory controller, current through a node according to the control signal, a voltage at the node corresponding to the pipeline clock signal; and
providing, by the memory controller, the data from the one or more memory cells through the pipeline, according to the pipeline clock signal.

14. The method of claim 13, further comprising:
enabling, by the memory controller, an inverter of a latch coupled to the node, according to the control signal.

15. The method of claim 13, wherein generating, by the memory controller based on the second delayed clock signal and the memory clock signal, the pipeline clock signal includes:
controlling, by the memory controller, a first transistor according to the memory clock signal, and
controlling, by the memory controller, a second transistor according to the second delayed clock signal, the first transistor and the second transistor coupled to a node in parallel, a voltage at the node corresponding to the pipeline clock signal.

16. The method of claim 15, further comprising:
enabling, by the memory controller, an inverter of a latch coupled to the node, according to the memory clock signal or the second delayed clock signal.

* * * * *